United States Patent
Choi

(10) Patent No.: US 6,525,581 B1
(45) Date of Patent: Feb. 25, 2003

(54) DUTY CORRECTION CIRCUIT AND A METHOD OF CORRECTING A DUTY

(75) Inventor: Young Bae Choi, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/033,989

(22) Filed: Dec. 28, 2001

(30) Foreign Application Priority Data

Sep. 20, 2001 (KR) .......................................... 2001-58153

(51) Int. Cl.⁷ .............................................. H03K 3/017
(52) U.S. Cl. ....................................................... 327/175
(58) Field of Search ............................. 327/172, 175, 327/176, 291, 292, 295, 296

(56) References Cited

U.S. PATENT DOCUMENTS

| | | | | |
|---|---|---|---|---|
| 5,572,158 A | * | 11/1996 | Lee et al. ................... | 327/170 |
| 5,614,855 A | | 3/1997 | Lee et al. ................... | 327/158 |
| 5,757,218 A | * | 5/1998 | Blum ......................... | 327/172 |
| 5,808,498 A | | 9/1998 | Donnelly et al. ........... | 327/255 |
| 5,940,669 A | | 8/1999 | Bacus et al. ................ | 399/302 |
| 5,945,857 A | * | 8/1999 | Havens ....................... | 327/134 |
| 5,945,862 A | | 8/1999 | Donnelly et al. ........... | 327/278 |
| 6,011,732 A | | 1/2000 | Harrison et al. ............ | 365/194 |
| 6,060,922 A | * | 5/2000 | Chow et al. ................ | 327/175 |
| 6,119,242 A | | 9/2000 | Harrison ..................... | 713/503 |
| 6,125,157 A | | 9/2000 | Donnelly et al. ........... | 375/371 |
| 6,169,434 B1 | | 1/2001 | Portmann ................... | 327/175 |
| 6,181,178 B1 | * | 1/2001 | Choi .......................... | 327/158 |
| 6,320,437 B1 | * | 11/2001 | Ma ............................. | 327/153 |
| 6,448,828 B2 | * | 9/2002 | Stark et al. ................. | 327/170 |

FOREIGN PATENT DOCUMENTS

| | | |
|---|---|---|
| JP | 8265112 | 10/1996 |
| JP | 188529 | 7/2000 |

* cited by examiner

Primary Examiner—My-Trang Nuton
(74) Attorney, Agent, or Firm—Ladas & Parry

(57) ABSTRACT

The present invention discloses a duty correction circuit for and method of enabling a clock signal and a clock bar signal phase transited from the clock signal by a phase difference of 180° to obtain a duty of 50%. The duty correction circuit includes: a duty check block for determining the duty of a clock signal, and generating a control signal indicating a determination result; and a duty correction block for receiving the clock signal or a clock bar signal, having a phase difference of 180° from the clock signal, correcting the duty of one of the clock signal or the clock bar signal according to the control signal from the duty check block, and outputting the duty-corrected signal. The method includes several steps, which reflect the procedure for correction of the duty.

20 Claims, 5 Drawing Sheets

DUTY CORRECTION CIRCUIT AND A METHOD OF CORRECTING A DUTY

BACKGROUND OF THE INVENTION

1. Field of the Invention

The present invention relates in general to a duty correction circuit, and in particular to a duty correction circuit which can enable input clocks used in the DDR DRAM and RAMBUS DRAM to have a duty approximately equal to 50%.

2. Description of the Background Art

In general, a DDR DRAM does not correct a duty. A duty error of an input clock has a specification of ±5%, and a jitter has a specification of ±10%. That is, when the frequency is 166 MHz, the jitter specification is ±600 ps, and the duty error of the input clock is ±300 ps. When the duty error of the input clock is reflected to an output clock and an output data as it is, the considerable jitter specification is ±300, and thus there is little margin in the circuit design.

Accordingly, many duty correction circuits have been suggested. However, it is difficult to form a duty correction circuit of a CMOS clock in a digital type. Such duty correction circuits correct the duty when a clock signal clk and a clock bar signal clkb have the same duty error. In the case that the clock signal clk and the clock bar signal clkb have different duty errors, namely a completely complementary relationship, for example when the duty of the clock signal clk is 40% and the duty of the clock bar signal clkb is 60%, the aforementioned duty correction circuits correct only one of the duties, but not the other.

SUMMARY OF THE INVENTION

Accordingly, it is an object of the present invention to provide a circuit for correcting a duty of a CMOS clock.

Another object of the present invention is to provide a duty correction circuit which can reduce a layout area on a semiconductor IC chip surface.

Still another object of the present invention is to provide a duty correction circuit that can be easily designed.

In order to achieve the above-described objects of the invention, there is provided a duty correction circuit including: a duty check block for determining a duty of a clock signal, and generating a control signal indicating the determination result; and a duty correction block for receiving the clock signal or a clock bar signal having a phase difference of 180° with respect to the clock signal, correcting a duty of one of the clock signal or clock bar signal according to the control signal from the duty check block, and outputting the duty-corrected signal. The duty check block determines whether the duty of the clock signal is 50%, below 50% or over 50%. Here, the duty correction unit corrects the duty of the clock signal when the duty of the clock signal is below 50%, corrects the duty of the clock bar signal when the duty of the clock signal is over 50%, and outputs the clock signal or clock bar signal without correction when the duty of the clock signal is 50%.

The duty check block includes: a first switch controlled according to the clock signal; a second switch controlled according to the clock bar signal; a first capacitor charged or discharged by the on or off state of the first switch; and a second capacitor charged or discharged by the on or off state of the second switch. In addition, the duty check block further includes a comparator for comparing a voltage applied to the first capacitor with a voltage applied to the second capacitor, and generating the control signal.

The duty correction unit includes: a clock signal correction unit enabled according to the control signal for correcting the duty of the clock signal, when the duty of the clock signal is below 50%; and a clock bar signal correction unit enabled according to the control signal for correcting the duty of the clock bar signal, when the duty of the clock signal is over 50%. The clock signal correction unit includes: a first phase blending circuit for enabling the clock signal to have a predetermined slope; a first delay circuit for delaying the clock signal for a predetermined time; and a second phase blending circuit for enabling the output signal from the first delay circuit to have a predetermined slope. The first phase blending circuit and the second phase blending circuit have their output terminals electrically connected. The clock bar signal correction unit includes: a third phase blending circuit for enabling the clock bar signal to have a predetermined slope; a second delay circuit for delaying the clock bar signal for a predetermined time; and a fourth phase blending circuit for enabling the output signal from the second delay circuit to have a predetermined slope. The third phase blending circuit and the fourth phase blending circuit have their output terminals electrically connected.

Preferably, the duty correction circuit further includes a clock buffer block for receiving the output signal from the duty correction unit, and generating a new clock signal and clock bar signal, which have a phase difference of 180° from each other. The clock buffer unit includes two inverter chains for receiving the output signal from the duty correction unit. One inverter chain comprises an even number of inverters, and the other inverter chain comprises an odd number of inverters.

In accordance with the present invention, the duty correction operation is performed after checking up the duty error of the input clocks used in a high speed memory device, and confirming whether the clocks have a duty over 50% or below 50%. That is, one clock is duty-corrected by using a circuit for sensing which of the clocks has the error in which side, and then two clocks having a phase difference of 180° are newly generated by using the corrected clock signal. Therefore, the duty of the CMOS clock can be precisely corrected in the above-described construction. In addition, the duty correction circuit has a simpler structure than an analog-type duty correction circuit, thereby reducing the layout area and simplifying the design.

BRIEF DESCRIPTION OF THE DRAWINGS

The present invention will become better understood with reference to the accompanying drawings which are given only by way of illustration and thus are not intended to limit the present invention, wherein.

DETAILED DESCRIPTION OF THE PREFERRED EMBODIMENTS

Figure 1:
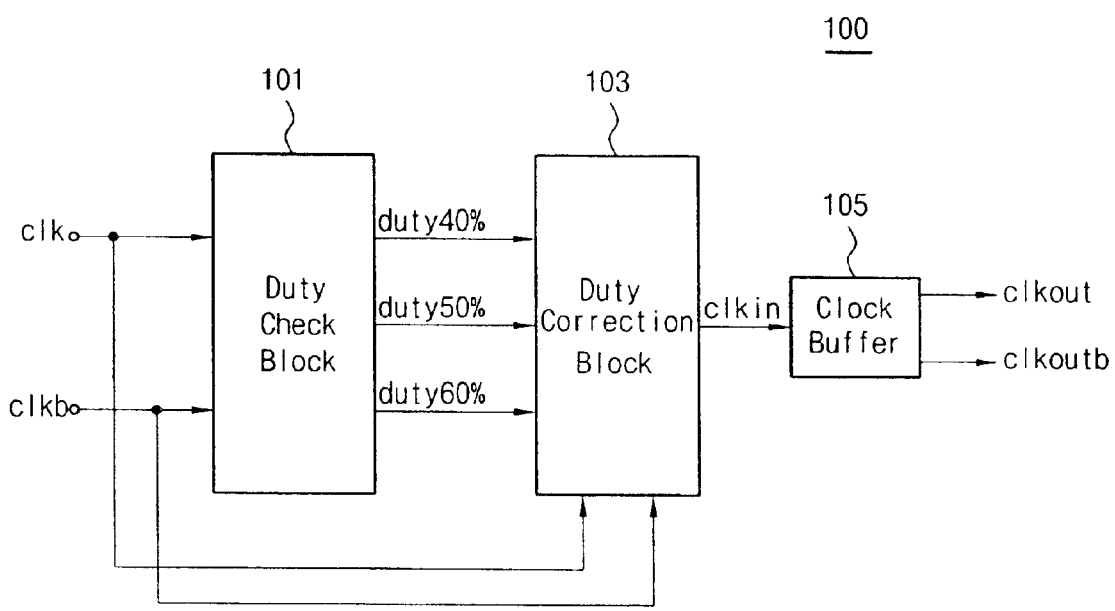
FIG. 1 is a block diagram illustrating a duty correction circuit in accordance with the present invention.

A duty correction unit in accordance with a preferred embodiment of the present invention will now be described in detail with reference to the accompanying drawings.

For better understanding of the present invention, in the following description, identical identification reference numerals are used for the same or similar elements or signals, even when represented in the different drawings.

Referring to FIG. 1, the duty correction circuit 100 includes a duty check block 101, a duty correction unit 103 and a clock buffer 105. In FIG. 1, clk denotes a clock signal, clkb denotes a clock bar signal phase-transited by 180° from the clock signal clk, duty40% denotes a signal activated when the duty of the clock signal clk is below 50%, duty50% denotes a signal activated when the duty of the clock signal clk is 50%, and duty60% denotes a signal activated when the duty of the clock signal clk is over 50%. In addition, clkin denotes a clock signal corrected by the duty correction unit 103, and clkout and clkoutb respectively denote clock signals which are generated by the clock buffer 105 after receiving the clock signal clkin, and have a phase difference of 180° from each other.

The duty check block 101 receives the clock signals clk and clkb, and determines whether the duty of the clock signal clk is below 50%, over 50% or at 50%. When the duty of the clock signal clk is below 50%, the signal duty40% is activated and used as a signal for controlling the duty correction unit 103. When the duty of the clock signal clk is over 50%, the signal duty60% is activated and used as the signal for controlling the duty correction unit 103. When the duty of the clock signal clk is 50%, the signal duty50% is activated and used as the signal for controlling the duty correction unit 103.

The duty correction unit 103 appropriately delays the clock signals clk and clkb by using the control signals duty40%, duty50% and duty60% from the duty check block 101, thereby correcting the duty. When the duty of the clock signal clk is below 50%, the signal duty40% is activated by the duty check block 101. According to the signal duty40%, the duty correction unit 103 delays the clock signal clk for a predetermined time to obtain the duty of 50%, and outputs the corrected signal to the clock buffer 105. When the duty of the clock signal clk is over 50%, the signal duty60% is activated by the duty check block 101. According to the signal duty60%, the duty correction unit 103 delays the clock bar signal clkb for a predetermined time to obtain the duty of 50%, and outputs the corrected signal to the clock buffer 105. When the duty of the clock signal clk is 50%, the clock or clock bar signal clk or clkb is outputted without duty correction. Accordingly, the output signal clkin from the duty correction unit 105 is a delay signal of the clock signal clk when the signal duty40% is activated, and a delay signal of the clock bar signal clkb when the signal duty 60% is activated. As a result, the output signal clkin has a duty approximately equal to 50%.

The clock buffer unit 105 receives the output signal clkin from the duty correction unit 103, and generates a clock signal clkout and a clock bar signal clkoutb which have a phase difference of 180° with respect to each other.

Figure 2A:
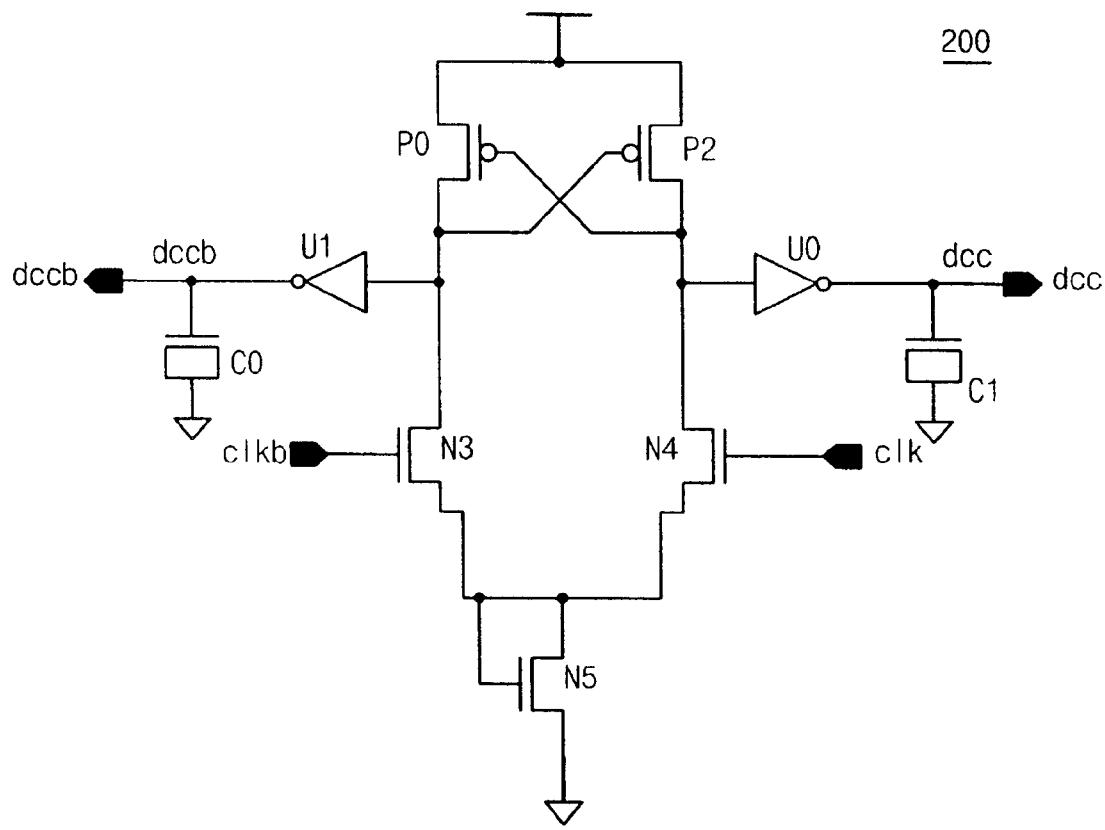
FIG. 2A is a circuit diagram illustrating a duty check block in accordance with the present invention.

FIG. 2A is a circuit diagram illustrating the duty check block 101 in accordance with the present invention. As illustrated in FIG. 2A, the duty check block includes: a duty error judgment circuit 200 for determining the side the duty of the input clock which has an error; and FIG. 2B shows a comparator 202 for generating a control signal for controlling the duty correction unit 103 by using the output signal from the duty error determination circuit 200.

As depicted in FIG. 2A, the duty error judgment circuit 200 includes: an NMOS transistor N4 controlled according to the clock signal clk for serving as a first switch; an NMOS transistor N3 controlled according to the clock bar signal clkb for serving as a second switch; a capacitor C1 charged or discharged by an on or off state of the NMOS transistor N4; and a capacitor C0 charged or discharged by an on or off state of the NMOS transistor N3. The capacitors C0 and C1 may comprise NMOS transistors having a high capacitance.

When the duty of the clock signal is over 50%, a charging amount is larger than a discharging amount, and thus electric charges are continuously charged in the capacitors C0 or C1. When the duty of the clock signal is below 50%, the discharging amount is larger than the charging amount, and thus the capacitors are continuously discharged. For example, when the clock signal has a high level period over 50%, the charging amount is larger than the discharging amount. Therefore, a level of a node dcc is increased, but a level of a node dccb is decreased. In the case that the clock signal clkb has a high level period over 50%, the opposite result is obtained. Here, dcc and dccb also denote voltage signals of the corresponding nodes. It is possible to judge in which side the duty error of the input clock signal is generated by using the voltage signals dcc and dccb, and also to make the determination as to which of the clock signals clk and clkb should be used in a phase blending block.

Figure 2B:
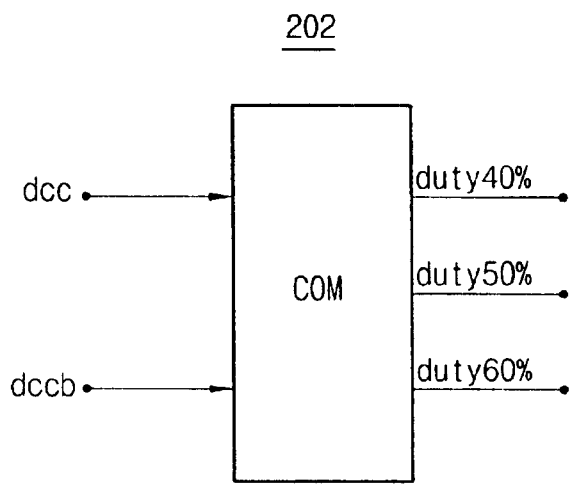
FIG. 2B is a block diagram of the comparator portion of the duty check block in accordance with the present invention.

As illustrated in FIG. 2B, the comparator 202 compares a magnitude of the voltage dcc applied to the capacitor C1 with a magnitude of the voltage dccb applied to the capacitor C0, so that the signal duty40% can be outputted when the duty is below 50%, and the signal duty60% can be outputted when the duty is over 50%. Here, when the duty is exactly 50%, the signal duty50% is outputted without correction. As is described above, the output signals are used as the control signals for controlling the duty correction unit 103.

Figure 3:
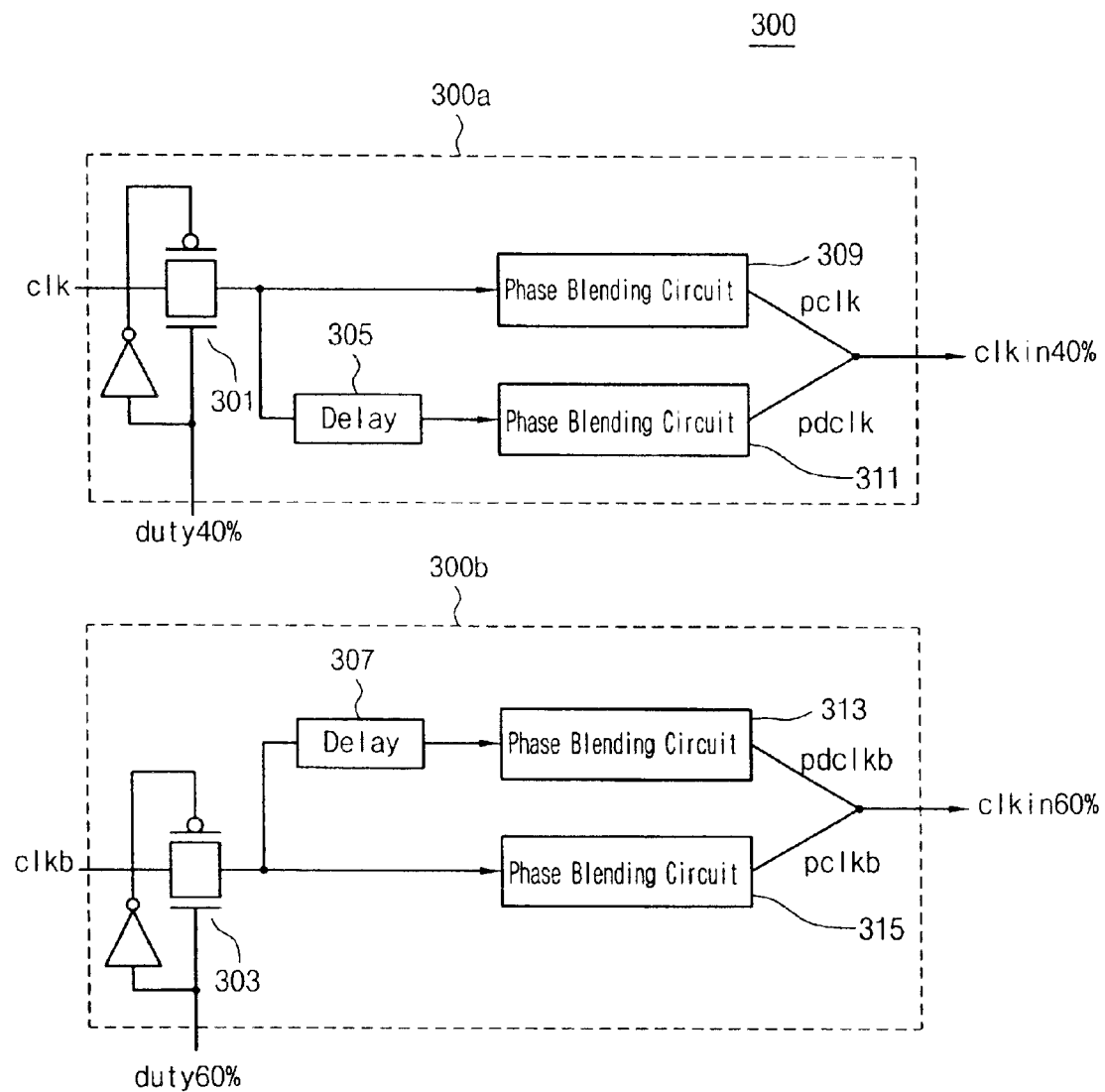
FIG. 3 is a circuit diagram illustrating a duty correction unit in accordance with the present invention.

FIG. 3 is a circuit diagram illustrating the duty correction unit in accordance with the present invention. Referring to FIG. 3, the duty correction unit 300 includes: a clock signal correction unit 300a for correcting the duty of the clock signal clk; and a clock bar signal correction unit 300b for correcting the duty of the clock bar signal clkb having a phase difference of 180° with respect to the clock signal clk. In FIG. 3, clk and clkb denote the externally-inputted clock signals, duty40% and duty60% denote control signals generated by the duty check block 101 (FIG. 1), pclk denotes a clock signal obtained after the clock signal clk passes a phase blending circuit 309, pdclk denotes a clock signal obtained after the clock signal clk passes a delay circuit 305 and a phase blending circuit 311, pclkb denotes a clock signal obtained after the clock signal clkb passes the phase blending circuit 315, and pdclkb denotes a clock signal obtained after the clock signal clkb passes a delay circuit 307 and a phase blending circuit 313.

The phase blending circuits 309 and 315 respectively invert the clock signal clk and the clock bar signal clkb with a predetermined slope value. The delay circuits 305 and 307 delay the clock signal clk or clock bar signal clkb for a predetermined time to provide the required duty correction. The phase blending circuits 311 and 313 respectively invert the output signals from the delay circuits 305 and 307 with a predetermined slope value. The phase blending circuits 309 and 311 have their output terminals physically combined to be connected to the output terminal of the duty correction unit 103. In addition, the phase blending circuits 313 and 315 have their output terminals physically combined to be connected to the output terminal of the duty correction unit 103.

The transmission gate 301 is controlled according to the signal duty40%, and the transmission gate 303 is controlled according to the signal duty60%. Accordingly, when the duty of the clock signal clk is below 50%, the signal duty40% is activated in the clock signal correction unit 300a, and thus the clock signal clk is transmitted to the phase blending circuit 309 and the delay unit 305 through the transmission gate 301. The clock signal clk transmitted to the delay circuit 305 is delayed for a predetermined time for duty correction, and provided to the phase blending circuit 311. The phase blending circuits 309 and 311 are inverters for inverting the input signal. Here, a rising edge and falling edge of the clock signal have a predetermined slope to successfully blend the signal pclk and the signal pdclk in the output terminal. The duty correction is embodied by blending the signals. The operation of the clock signal correction unit 300b is performed in the same manner as the operation of the clock signal correction unit 300a.

As described above, the signal duty40% is used when the clock signal clk is inputted to the duty correction unit 300, and the signal duty60% is used when the clock bar signal clkb is inputted to the duty correction unit 300. As illustrated in FIG. 3, since the identical circuit is used to correct the duty of the clock signal clk and the clock bar signal clkb, if one signal has its duty corrected to 50% by the respective clock correction units 300a,300b, the other signal has a poor or invalid duty.

In order to solve the foregoing problem, the duty check block 101 of FIG. 1 is used to determine the side the duty which has the error, and then one of the signals duty40%, duty50% and duty60% is activated to select one of the clock signal clk and the clock bar signal clkb. The duty error correction is embodied by blending the original clock and delayed clock, and thus is smoothly performed when the duty error is below 50%. Therefore, the duty check block 101 is required, and the signal having a duty below 50% is always selected by using the signals duty40% and duty60% generated by the duty clock block 101. In the case of the duty of 50%, the clock signal clk or the clock bar signal clkb is outputted without duty correction, and without passing the duty correction unit 103.

Figure 4:
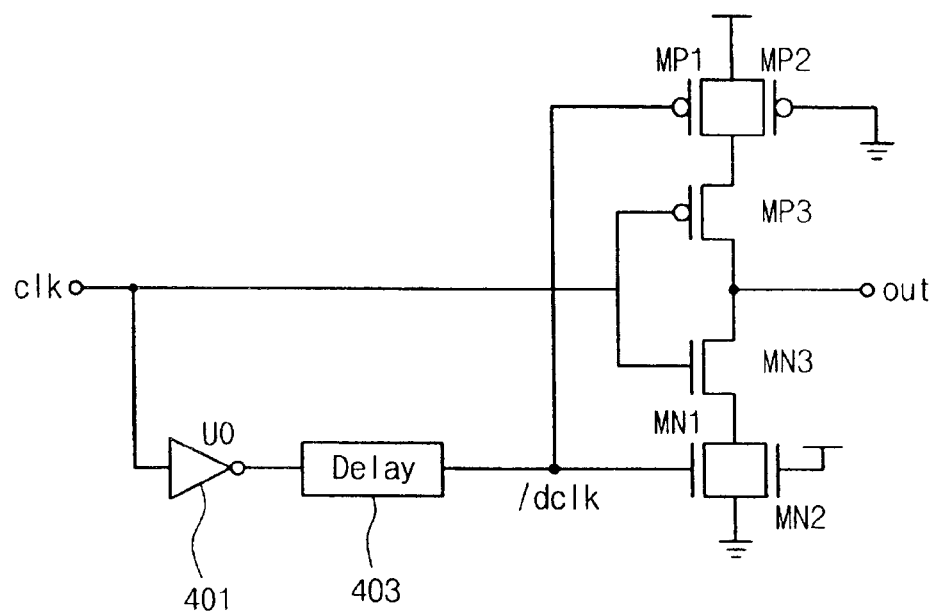
FIG. 4 is a circuit diagram illustrating a phase blending circuit in accordance with the present invention.

FIG. 4 is a circuit diagram illustrating the phase blending circuit in accordance with the present invention. As depicted in FIG. 4, the phase blending circuit includes NMOS transistors MN1, MN2 and MN3 and PMOS transistors MP1, MP2 and MP3. In addition, the phase blending circuit further includes an inverter 401 and a delay circuit 403 for inputting the clock signal /dclk obtained by inverting and delaying the clock signal clk for a predetermined time to the PMOS transistor MP1 and the NMOS transistor MN1. The delay circuit 403 preferably comprises an inverter chain having an even number of inverters. Accordingly, the inverter 401 and the delay circuit 403 may be incorporated by connecting an odd number of inverters.

In FIG. 4, clk denotes the clock signal of FIG. 3, and the phase blending circuit represents the phase blending circuit 309 receiving the clock signal clk. The designation /dclk denotes the clock signal obtained by delaying and inverting the clock signal clk. Here, a circuit for generating the signal /dclk from the clock signal clk has been known to those of skill in the field, and thus is not further described herein or illustrated in FIG. 4.

In FIG. 4, the PMOS transistor MP2 is a weak transistor having a larger length and smaller width than the other PMOS transistors MP1 and MP3, and the NMOS transistor MN2 is a weak transistor having a larger length and smaller width than the other NMOS transistors MN1 and MN3. The PMOS transistor MP2 is always turned on by grounding its gate, as shown, and forms a path so that the current can pass the circuit even when the PMOS transistor MP1 is turned off. The NMOS transistor MN2 is always turned on by connecting its gate to the power terminal, and forms such a path that the current can pass the circuit even when the MMOS transistor MN1 is turned off. The clock signal clk is inputted to the gates of the PMOS transistor MP3 and the NMOS transistor MN3, and the clock bar signal /dclk is inputted to the gates of the PMOS transistor MP1 and the NMOS transistor MN1.

Figure 5:
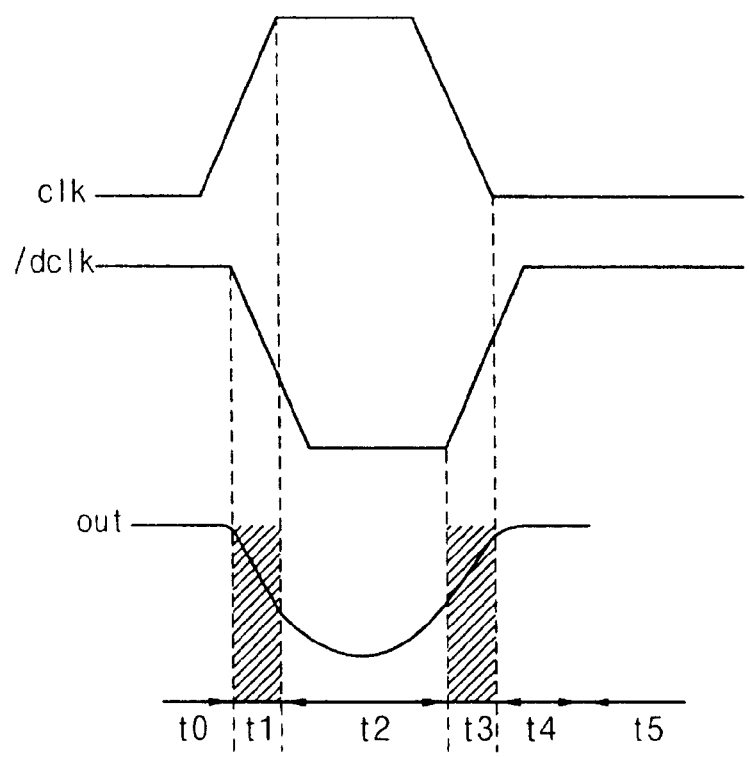
FIG. 5 is a waveform diagram of signals for explaining the operation of the phase blending circuit in accordance with the present invention.

The operation of the circuit of FIG. 4 will now be explained with reference to FIG. 5. Referring to FIG. 5, an output signal "out" is similar to an inverted signal of the clock signal clk. Those portions t1 and t3 shown marked between the broken lines are steep-slope periods generated because the clock signal /dclk is further delayed than the clock signal clk. In these periods, the phase blending circuit shown in FIG. 4 is operated as the general inverter. However, the slope of the output signal "out" becomes less steep in the other portions t2 and t4 as a result of the transistors MN2 and MP2. As described above with reference to FIG. 3, the slope of the output signal out is reduced to efficiently blend the signals in the output terminal of the duty correction unit 103. That is, the phase blending circuit adjusts the slope of the clock signal, and thus the duty of the input clocks is corrected by blending the input signals having the appropriate slope.

Figure 6:
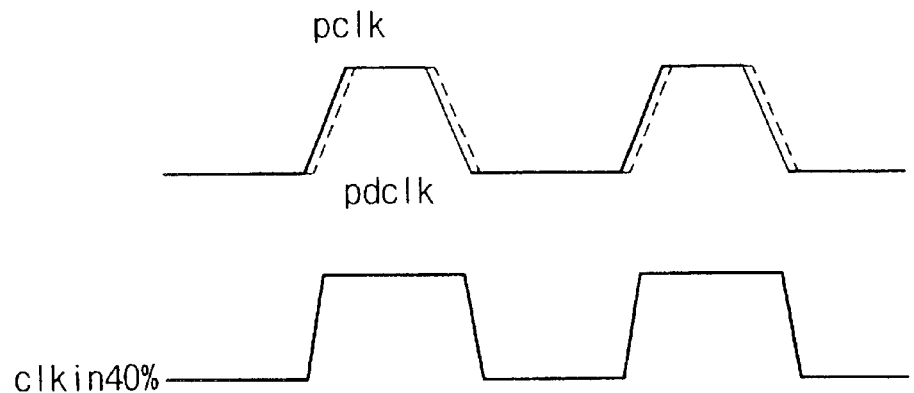
FIG. 6 is a waveform diagram of signals for explaining the operation of the duty correction unit in accordance with the present invention.

FIG. 6 is a waveform diagram of signals for explaining the operation of the duty correction unit in accordance with the present invention. Here, the principle of generating the clock signal clkin40% by blending the output signal pclk from the phase blending circuit 309 and the output signal pdclk from the phase blending circuit 311 will now be explained.

Figure 7:
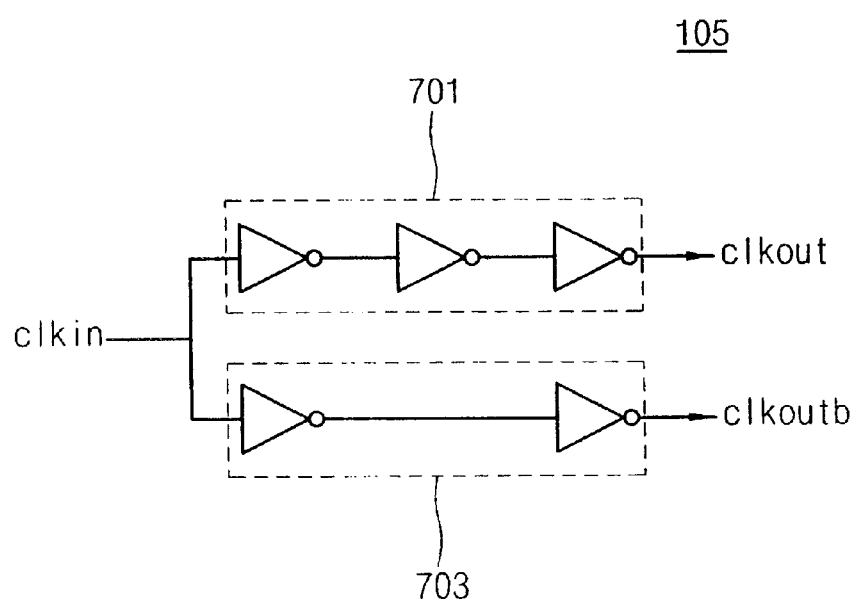
FIG. 7 is a circuit diagram illustrating a clock buffer unit in accordance with the present invention.

FIG. 7 is a circuit diagram illustrating the clock buffer unit 105 (FIG. 1) in accordance with the present invention. The clock buffer unit includes a first branch 701 having an odd number of inverters, and a second branch 702 having an even number of inverters. In FIG. 7, clkin denotes the output signals clkin40% and clkin60% of FIG. 3, clkout denotes the output signal from the first branch 701, and clkoutb denotes the output signal from the second branch 703. Here, clkoutb and clkout have a phase difference of 180° with respect to each other.

The clock signal having its duty corrected through the duty correction unit 103 is used to generate two clocks through a clock buffer circuit 105 of FIG. 7. In the design of the clock buffer circuit 105, the output clock signals clkout and clkoutb have the identical timing as the capacitor.

As discussed earlier, in accordance with the present invention, the duty of the CMOS clock is precisely corrected. Moreover, the duty correction circuit has a simpler configuration than the analog type duty correction circuit, thereby reducing the layout area and simplifying the design.

As the present invention may be embodied in several alternate forms without departing from the spirit or essential characteristics of the invention described above, it should also be understood that the above-described embodiment is not limited by any of the details of the foregoing description, unless otherwise specified, but rather should be construed broadly within its spirit and scope as defined in, and limited only by, the appended claims, and therefore all changes and modifications that fall within the metes and bounds of the claims, or equivalences of such metes and bounds, are therefore intended to be embraced by the appended claims.

What is claimed is:

1. A duty correction circuit comprising:
    a duty check block connected to a clock signal and a clock bar signal for determining a duty of the clock signal or the clock bar signal, and generating a control signal indicating a determination result; and
    a duty correction block for receiving the clock signal and the clock bar signal, having a phase difference of 180° from the clock signal, correcting the duty of one of the clock signal or clock bar signal according to the control signal from the duty check block, and outputting the duty-corrected signal.

2. The circuit according to claim 1, wherein the duty check block determines whether the duty of the clock signal is 50%, below 50% or over 50%.

3. The circuit according to claim 2, wherein the duty correction unit corrects the duty of the clock signal when the duty of the clock signal is below 50%, corrects the duty of the clock bar signal when the duty of the clock signal is over 50%, and outputs the clock signal or clock bar signal without duty correction when the duty of the clock signal is 50%.

4. The circuit according to claim 1, wherein the duty check block comprises:
    a first switch controlled according to the clock signal;
    a second switch controlled according to the clock bar signal;
    a first capacitor charged or discharged by an on or off state of the first switch; and
    a second capacitor charged or discharged by an on or off state of the second switch.

5. The circuit according to claim 4, wherein the duty check block further comprises a comparator for comparing the voltage applied to the first capacitor with the voltage applied to the second capacitor, and for generating the control signal.

6. The circuit according to claim 1, wherein the duty correction unit comprises:
    a clock signal correction unit enabled according to the control signal for correcting the duty of the clock signal when the duty of the clock signal is below 50%; and
    a clock bar signal correction unit enabled according to the control signal for correcting the duty of the clock bar signal when the duty of the clock signal is over 50%.

7. The circuit according to claim 6, wherein the clock signal correction unit comprises:
    a first phase blending circuit for enabling the clock signal to have a predetermined slope;
    a first delay circuit for delaying the clock signal for a predetermined time; and
    a second phase blending circuit for enabling the output signal from the first delay circuit to have a predetermined slope, the first phase blending circuit and the second phase blending circuit having their output terminals electrically connected.

8. The circuit according to claim 6, wherein the clock bar signal correction unit comprises:
    a third phase blending circuit for enabling the clock bar signal to have a predetermined slope;
    a second delay circuit for delaying the clock bar signal for a predetermined time; and
    a fourth phase blending circuit for enabling the output signal from the second delay circuit to have a predetermined slope, the third phase blending circuit and the fourth phase blending circuit having their output terminals electrically connected.

9. The circuit according to claim 1, further comprising a clock buffer block for receiving the output signal from the duty correction unit, and generating a new clock signal and a new clock bar signal which have a phase difference of 180° with respect to each other.

10. The circuit according to claim 9, wherein the clock buffer unit comprises two inverter chains for receiving the output signal from the duty correction unit, one inverter chain comprising an even number of inverters, and the other inverter chain comprising an odd number of inverters.

11. A duty correction circuit comprising:
    a duty check block connected to a clock signal and a clock bar signal for determining whether a duty of the clock signal is 50%, below 50% or over 50%, and generating a control signal indicating a determination result; and
    a duty correction block for receiving the clock signal and the clock bar signal having a phase difference of 180° with respect to the clock signal, correcting the duty of the clock signal when the duty of the clock signal is below 50%, correcting the duty of the clock bar signal when the duty of the clock signal is over 50%, and outputting the clock signal or clock bar signal without duty correction when the duty of the clock signal is 50%.

12. The circuit according to claim 11, wherein the duty check block comprises:
    a first switch controlled according to the clock signal;
    a second switch controlled according to the clock bar signal;
    a first capacitor charged or discharged by an on or off state of the first switch;
    a second capacitor charged or discharged by an on or off state of the second switch; and
    a comparator for comparing the voltage applied to the first capacitor with the voltage applied to the second capacitor, and for generating the control signal.

13. The circuit according to claim 11, wherein the duty correction unit comprises:
    a clock signal correction unit enabled according to the control signal for correcting the duty of the clock signal when the duty of the clock signal is below 50%; and
    a clock bar signal correction unit enabled according to the control signal for correcting the duty of the clock bar signal when the duty of the clock signal is over 50%,
    wherein the clock signal correction unit further comprises:
        a first phase blending circuit for enabling the clock signal to have a predetermined slope;
        a first delay circuit for delaying the clock signal for a predetermined time; and
        a second phase blending circuit for enabling the output signal from the first delay circuit to have a predetermined slope, the first and second phase blending circuits having their output terminals electrically connected, and
    wherein the clock bar signal correction unit further comprises:
        a third phase blending circuit for enabling the clock bar signal to have a predetermined slope;

a second delay circuit for delaying the clock bar signal for a predetermined time; and a fourth phase blending circuit for enabling the output signal from the second delay circuit to have a predetermined slope, the third and fourth phase blending circuits having their output terminals electrically connected.

14. The circuit according to claim 11, further comprising a clock buffer block for receiving the output signal from the duty correction unit, and generating a new clock signal and a new clock bar signal which have a phase difference of 180° with respect to each other.

15. The circuit according to claim 14, wherein the clock buffer unit comprises two inverter chains for receiving the output signal from the duty correction unit, one inverter chain comprising an even number of inverters, and the other inverter chain comprising an odd number of inverters.

16. A method for correcting a duty of a clock signal, comprising:

a duty check step connecting a clock signal and a clock bar signal for determining whether the duty of the clock signal is 50%, below 50% or over 50%; and a duty correction step for correcting the duty of the clock signal when the duty of the clock signal is determined to be below 50%, correcting the duty of the clock bar signal when the duty of the clock signal is determined to be over 50%, and outputting the clock signal or clock bar signal without correction when the duty of the clock signal is determined to be approximately equal to 50%.

17. The method according to claim 16, wherein the correction of the clock signal in the duty check step comprises:

a first step for enabling the clock signal to have a predetermined slope;

a second step for delaying the clock signal, and enabling the delayed clock signal to have a predetermined slope; and a third step for blending the resulting signals of the first and second steps.

18. The method according to claim 17, wherein the correction of the clock bar signal in the duty check step further comprises:

a fourth step for enabling the clock bar signal to have a predetermined slope;

a fifth step for delaying the clock bar signal, and enabling the delayed clock bar signal to have a predetermined slope; and a sixth step for blending the resulting signals of the fourth and fifth steps.

19. The circuit according to claim 16, further comprising a clock buffering step that comprises receiving the output signal of the duty correction step, and generating a new clock signal and a new clock bar signal which have a phase difference of 180° with respect to each other.

20. The circuit according to claim 19, wherein the clock buffering step further comprises:

a step for enabling the output signal of the duty correction step to pass through an inverter chain having an even number of inverters; and a step for enabling the output signal of the duty correction step to pass through an inverter chain having an odd number of inverters.

* * * * *